United States Patent
Miyao et al.

(10) Patent No.: US 11,230,796 B2
(45) Date of Patent: Jan. 25, 2022

(54) RESIN MATERIAL, VINYL BAG, POLYCRYSTALLINE SILICON ROD, POLYCRYSTALLINE SILICON MASS

(71) Applicant: SHIN-ETSU CHEMICAL CO., LTD., Tokyo (JP)

(72) Inventors: Shuichi Miyao, Niigata (JP); Shigeyoshi Netsu, Niigata (JP); Kazunori Watanabe, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/747,834

(22) PCT Filed: Aug. 2, 2016

(86) PCT No.: PCT/JP2016/072596
§ 371 (c)(1),
(2) Date: Jan. 26, 2018

(87) PCT Pub. No.: WO2017/047260
PCT Pub. Date: Mar. 23, 2017

(65) Prior Publication Data
US 2018/0223450 A1     Aug. 9, 2018

(30) Foreign Application Priority Data

Sep. 15, 2015 (JP) ................. 2015-181876

(51) Int. Cl.
| C30B 35/00 | (2006.01) |
| B65D 65/38 | (2006.01) |
| C01B 33/035 | (2006.01) |
| C08F 14/26 | (2006.01) |
| C30B 13/00 | (2006.01) |
| C30B 15/00 | (2006.01) |
| C30B 29/06 | (2006.01) |

(52) U.S. Cl.
CPC ........... C30B 35/002 (2013.01); B65D 65/38 (2013.01); C01B 33/035 (2013.01); C08F 14/26 (2013.01); C30B 13/00 (2013.01); C30B 15/00 (2013.01); C30B 29/06 (2013.01)

(58) Field of Classification Search
CPC ..... C30B 35/002; C30B 33/035; C30B 13/00; C30B 15/00; C30B 29/06; B65D 65/38; C08F 14/26
See application file for complete search history.

(56) References Cited

U.S. PATENT DOCUMENTS

| 5,350,489 | A | 9/1994 | Muraoka | |
| 6,225,424 | B1* | 5/2001 | Nishikawa | C08F 10/02 428/35.7 |
| 6,309,467 | B1 | 10/2001 | Wochner et al. | |
| 8,833,042 | B2 | 9/2014 | Wochner et al. | |
| 8,938,936 | B2 | 1/2015 | Vietz et al. | |
| 2005/0034430 | A1* | 2/2005 | Holzlwimmer | B65B 1/28 53/469 |
| 2006/0042539 | A1 | 3/2006 | Ohta | |
| 2010/0154357 | A1* | 6/2010 | Wochner | B65B 25/00 53/405 |
| 2012/0060562 | A1 | 3/2012 | Wochner et al. | |
| 2012/0175613 | A1* | 7/2012 | Netsu | C01B 33/037 257/49 |
| 2012/0198793 | A1 | 8/2012 | Vietz et al. | |
| 2013/0042582 | A1 | 2/2013 | Vietz et al. | |
| 2013/0189176 | A1* | 7/2013 | Wochner | C01B 33/021 423/348 |
| 2013/0219967 | A1 | 8/2013 | Hussy et al. | |
| 2013/0309524 | A1 | 11/2013 | Vietz et al. | |
| 2014/0037959 | A1 | 2/2014 | Wochner et al. | |
| 2014/0151259 | A1* | 6/2014 | Wochner | B29C 66/9241 206/524.1 |

(Continued)

FOREIGN PATENT DOCUMENTS

| CN | 101678905 A | 3/2010 |
| CN | 102498064 A | 6/2012 |

(Continued)

OTHER PUBLICATIONS

International Search Report dated Nov. 8, 2016, issued in Counterpart of International Application No. PCT/JP2016/072596 (2 pages) w/English Translation.
Office Action dated Jul. 31, 2018, issued in counterpart Japanese Application No. 2015-181876, with English translation (9 pages).
Office Action dated Nov. 6, 2018, issued in counterpart Japanese Application No. 2015-181876, with English machine translation. (9 pages).
Notice of Allowance dated Jan. 8, 2019, issued in counterpart Japanese Application No. 2015-181876, with English machine translation. (6 pages).

(Continued)

*Primary Examiner* — Sheng H Davis
*Assistant Examiner* — Michael Forrest
(74) *Attorney, Agent, or Firm* — Westerman, Hattori, Daniels and Adrian, LLP

(57) ABSTRACT

According to the present invention, a resin material that has the following surface concentration of impurities is consistently used in production of polycrystalline silicon. Values obtained from quantitative analysis by ICP-mass spectrometry using a 1 wt % nitric acid aqueous solution as an extraction liquid are: a phosphorous (P) concentration of 50 pptw or less; an arsenic (As) concentration of 2 pptw or less; a boron (B) concentration of 20 pptw or less; an aluminum (Al) concentration of 10 pptw or less; a total concentration of 6 elements of iron (Fe), chromium (Cr), nickel (Ni), copper (Cu), sodium (Na), and zinc (Zn) of 80 pptw or less; a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 100 pptw or less.

4 Claims, No Drawings

(56) References Cited

U.S. PATENT DOCUMENTS

| | | | |
|---|---|---|---|
| 2014/0165503 A1 | 6/2014 | Vietz et al. | |
| 2015/0003952 A1 | 1/2015 | Kurosawa et al. | |
| 2016/0167862 A1 | 6/2016 | Lichtenegger et al. | |
| 2017/0073235 A1* | 3/2017 | Miyao | C30B 29/06 |
| 2018/0339908 A1 | 11/2018 | Netsu et al. | |

FOREIGN PATENT DOCUMENTS

| | | | | |
|---|---|---|---|---|
| CN | 102633002 A | | 8/2012 | |
| CN | 103213988 A | | 7/2013 | |
| CN | 103848071 A | | 6/2014 | |
| EP | 0905796 B1 | | 4/2002 | |
| JP | 4-175350 A | | 6/1992 | |
| JP | H05074922 A | | 3/1993 | |
| JP | 8-75061 A | | 3/1996 | |
| JP | 2001-220446 A | | 8/2001 | |
| JP | 2003-37142 A | | 2/2003 | |
| JP | 2006143552 A | | 6/2006 | |
| JP | 2006-216825 A | | 8/2006 | |
| JP | 2009078961 A | | 4/2009 | |
| JP | 2009-298672 A | | 12/2009 | |
| JP | 2010046617 A | | 3/2010 | |
| JP | 2010528955 A | | 8/2010 | |
| JP | 2011194380 A | * | 10/2011 | B08B 3/12 |
| JP | 2012056579 A | | 3/2012 | |
| JP | 2012062243 A | | 3/2012 | |
| JP | 2012224541 A | | 11/2012 | |
| JP | 2013-039977 A | | 2/2013 | |
| JP | 2013-151413 A | | 8/2013 | |
| JP | 2013159504 A | | 8/2013 | |
| JP | 2013532111 A | | 8/2013 | |
| JP | 2013-213299 A | | 10/2013 | |
| JP | 2013-241330 A | | 12/2013 | |
| JP | 2013256445 A | | 12/2013 | |
| JP | 2014-31309 A | | 2/2014 | |
| JP | 2014-122153 A | | 7/2014 | |
| JP | 2015-73947 A | | 4/2015 | |
| JP | 2016531049 A | | 10/2016 | |
| WO | 2013150759 A1 | | 10/2013 | |

OTHER PUBLICATIONS

Office Action, dated Dec. 17, 2019, issued in Japanese Application No. 2019-009372, divisional of counterpart Japanese Application No. 2015-181876 (w/ English translation; 8 pages).

Notice of Reasons for Revocation of Japanese Patent No. 6472732 B2, dated Nov. 5, 2019, issued in counterpart Japanese Application No. 2015-181876 (w/ English translation; 27 pages).

Notice of Reasons for Revocation, dated Mar. 31, 2020, issued in Opposition No. 2019-700646 involving Japanese Patent No. 6472732B1, which corresponds to counterpart Japanese Application No. 2015-181876 (w/ English translation; 47 pages).

Takeshita, M. et al., "Polysilicon Production in Mitsubishi Materials Corporations", Journal of MMIJ, vol. 123, p. 704-706 (2007) (w/ English abstract and partial English translation; cited in Notice of Reasons for Revocation).

Decision on Opposition dated Sep. 8, 2020, issued in Opposition No. 2019-700646 regarding Japanese Patent No. 6472732 issued from counterpart Japanese Application No. 2015-181876 (w/ English machine translation, 62 pages).

Office Action dated Jul. 24, 2020, issued in counterpart Chinese Application No. 201680045027.X (w/ English translation, 17 pages).

Office Action dated Mar. 1, 2021, issued in counterpart Chinese Application No. 201680045027.X (10 pages; w/English machine translation).

Office Action dated Apr. 27, 2021, issued in counterpart Japanese Application No. 2020-104652 (6 pages; w/ English machine translation).

Office Action dated Aug. 3, 2021, issued in counterpart Japanese Chinese Application No. 2020-104652 (7 pages w/ English machine translation).

Office Action dated Jun. 4, 2021, issued in counterpart Chinese Application No. 201680045027.X (10 pages; w/English machine translation).

* cited by examiner

RESIN MATERIAL, VINYL BAG, POLYCRYSTALLINE SILICON ROD, POLYCRYSTALLINE SILICON MASS

TECHNICAL FIELD

The present invention relates to a resin material suitable for producing polycrystalline silicon used as a raw material for producing single crystalline silicon, and a vinyl bag.

BACKGROUND ART

A polycrystalline silicon mass is produced by crushing (pulverizing) a polycrystalline silicon rod that has been synthesized by a method such as Siemens method. The polycrystalline silicon mass used as a raw material for producing CZ-single crystalline silicon is crushed, which is then subjected to etching by a chemical solution such as nitrohydrofluoric acid for the purpose of removing contaminants adhered to the surface. After the chemical solution is rinsed away, a resultant product is inspected for the presence of any foreign substances on its surface, sorted into different sizes, and then packed as a finished product.

The polycrystalline silicon mass described above is expected to be highly pure both in terms of bulk and surface. For that reason, Patent Literature 1 (Japanese Patent Laid-Open No. 2013-151413), for example, discloses the invention intended to distinctly reduce dopants on the surface of polysilicon.

A reduction in a surface impurity concentration is achieved insufficiently only by etching using the chemical solution. Even if sufficient surface cleanliness of a product is achieved by etching, the surface impurity concentration becomes high again unless the product is properly handled in subsequent production steps.

CITATION LIST

Patent Literature

Patent Literature 1: Japanese Patent Laid-Open No. 2013-151413

SUMMARY OF INVENTION

Technical Problem

Accordingly, when producing a polycrystalline silicon rod used as a raw material for producing FZ-single crystalline silicon and a polycrystalline silicon mass used as a raw material for producing CZ-single crystalline silicon, surfaces of these polycrystalline silicon need to be kept clean throughout the production process.

The present invention has been completed in view of the foregoing problems. An object of the present invention is to provide a resin material which is suitable for keeping a surface of polycrystalline silicon clean and also does not lead to an increase in production cost of polycrystalline silicon, and a vinyl bag made of such a resin material.

Solution to Problem

To solve the above problem, a resin material according to the present invention has values obtained from quantitative analysis of surface impurities by ICP-mass spectrometry using a 1 wt % nitric acid aqueous solution as an extraction liquid, the values being a phosphorus (P) concentration of 50 pptw or less, an arsenic (As) concentration of 2 pptw or less, a boron (B) concentration of 20 pptw or less, an aluminum (Al) concentration of 10 pptw or less, a total concentration of 6 elements of iron (Fe), chromium (Cr), nickel (Ni), copper (Cu), sodium (Na), and zinc (Zn) of 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 100 pptw or less.

Preferably, a bulk impurity concentration includes a phosphorus (P) concentration of 3 ppmw or less, an arsenic (As) concentration of 1 ppmw or less for, a boron (B) concentration of 4 ppmw or less, and an aluminium (Al) concentration of 3 ppmw or less.

For example, the resin material is a plastic material.

In another aspect, the plastic material is a vinyl material.

A vinyl bag according to the present invention is made of the vinyl material, and the vinyl bag has values obtained from quantitative analysis of inner surface impurities of the bag by the ICP-mass spectrometry using a 1 wt % nitric acid aqueous solution as an extraction liquid, the values being a phosphorus (P) concentration of 50 pptw or less, an arsenic (As) concentration of 2 pptw or less, a boron (B) concentration of 20 pptw or less, an aluminum (Al) concentration of 10 pptw or less, a total concentration of 6 elements of iron (Fe), chromium (Cr), nickel (Ni), copper (Cu), sodium (Na), and zinc (Zn) of 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 100 pptw or less.

Preferably, the bulk impurity concentration includes a phosphorus (P) concentration of 3 ppmw or less, an arsenic (As) concentration of 1 ppmw or less, a boron (B) concentration of 4 ppmw or less, and an aluminum (Al) concentration of 3 ppmw or less.

A method for producing a polycrystalline silicon rod according to the present invention includes a step of handling the polycrystalline silicon rod that has been synthesized by the Siemens method, while keeping the polycrystalline silicon rod in the above-described vinyl bag.

A method for producing a polycrystalline silicon mass according to the present invention includes a step of using a jig made of the resin material described above when producing the polycrystalline silicon mass from the polycrystalline silicon rod that has been synthesized by the Siemens method.

As to the polycrystalline silicon rod according to the present invention, the polycrystalline silicon rod that has been synthesized by the Siemens method is packed in the vinyl bag.

Further, as to the polycrystalline silicon mass according to the present invention, the polycrystalline silicon mass is packed in the above-described vinyl bag and produced by crushing the polycrystalline silicon rod that has been synthesized by the Siemens method.

The jig made of the resin material described above includes not only a working glove but also a bag for packing the polycrystalline silicon rod, a mat used when crushing the polycrystalline silicon rod, a container for performing etching or rinsing, a tank for a chemical solution, a plumbing for circulating the chemical solution, and a pump member for circulating the chemical solution, for example.

Advantageous Effects of Invention

The present invention is suitable for keeping the surface of polycrystalline silicon clean, and also provides the resin material which does not lead to an increase in production cost of polycrystalline silicon and the vinyl bag made of such resin material.

DESCRIPTION OF EMBODIMENTS

In a production process of polycrystalline silicon, jigs that come into contact with the polycrystalline silicon include a vinyl bag (bag for packing) to cover a polycrystalline silicon rod, a mat (plate) used when crushing the polycrystalline silicon rod with a hammer, a glove made of a resin used when handling the polycrystalline silicon rod or mass, a container for performing etching or rinsing, a tank for a chemical solution, a plumbing for circulating the chemical solution, and a pump member for circulating the chemical solution. Thus, it is important to control a surface impurity concentration of these jigs at an appropriate value, and not to let a surface of polycrystalline silicon become contaminated.

According to the present invention, it is possible to control the surface impurity concentration of these jigs made of a resin material at an appropriate value.

More specifically, in the present invention, the resin material has values obtained from quantitative analysis of surface impurities by ICP mass spectrometry using a 1 wt % nitric acid aqueous solution as an extraction liquid, the values being a phosphorus (P) concentration of 50 pptw or less, an arsenic (As) concentration of 2 pptw or less, a boron (B) concentration of 20 pptw or less, an aluminum (Al) concentration of 10 pptw or less, a total concentration of 6 elements of iron (Fe), chromium (Cr), nickel (Ni), copper (Cu), sodium (Na), and zinc (Zn) of 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 100 pptw or less.

Preferably, a bulk impurity concentration includes a phosphorus (P) concentration of 3 ppmw or less, an arsenic (As) concentration of 1 ppmw or less, a boron (B) concentration of 4 ppmw or less, and an aluminum (Al) concentration of 3 ppmw or less.

The resin material described above is mainly a plastic material. In a certain aspect, the resin material is a vinyl material.

Accordingly, when the bag is made of a vinyl material, such a vinyl bag has values obtained from quantitative analysis of inner surface impurities of the bag by the ICP-mass spectrometry using a 1 wt % nitric acid aqueous solution as an extraction liquid, the values being a phosphorus (P) concentration of 50 pptw or less, an arsenic (As) concentration of 2 pptw or less, a boron (B) concentration of 20 pptw or less, an aluminum (Al) concentration of 10 pptw or less, a total concentration of 6 elements of iron (Fe), chromium (Cr), nickel (Ni), copper (Cu), sodium (Na), and zinc (Zn) of 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 100 pptw or less.

When producing the polycrystalline silicon rod, contamination of the polycrystalline silicon rod is prevented in such a manner that a production method includes a step of handling the polycrystalline silicon rod that has been synthesized by the Siemens method while keeping the polycrystalline silicon rod in the vinyl bag according to claim 5 or 6.

When producing the polycrystalline silicon mass from the polycrystalline silicon rod that has been synthesized by the Siemens method, contamination of the polycrystalline silicon mass is prevented in such a manner that the production method includes a step of using a jig made of the resin material described above.

Further, contamination of the polycrystalline silicon rod that has been synthesized by the Siemens method is prevented in such a manner that the polycrystalline silicon rod is packed in the vinyl bag described above.

Moreover, contamination of the polycrystalline silicon mass is prevented in such a manner that the polycrystalline silicon mass produced by crushing the polycrystalline silicon rod that has been synthesized by the Siemens method is packed in the vinyl bag described above.

The ICP-mass spectrometry is performed under the following conditions, for example.

In a case where the resin material is a vinyl material and has a bag-like shape, when analyzing inner surface impurities of that bag, 100 ml of a 1 wt %-nitric acid aqueous solution is added to an inner side of the vinyl bag to bring the aqueous solution into contact with an entire inner surface, and elements and metallic elements that become dopants in silicon crystals are extracted. Then, a quantitative measurement is performed on the extraction liquid. For example, P may be analyzed by an ICP-MS/MS analyzer (ICP-QQQ manufactured by Agilent Technologies, Inc., USA), and other elements may be analyzed by an ICP-MS analyzer (ICP-7500 manufactured by Agilent Technologies, Inc., USA).

As for the bulk impurity concentration, a secondary ion mass spectrometer (SIMS: PHI6650 manufactured by Physical Electronics, Inc., USA) was used to analyze the resin material and the vinyl material as they were. For a calibration curve, a standard sample was prepared in such a manner that P, As, B, and Al each having a concentration level equivalent to that of the resin material are injected into a single crystal of a diamond by an ion beam method, and an absolute calibration curve method was used to determine the quantity.

When the resin material according to the present invention is a vinyl material, the vinyl material preferably has high expansibility like polyethylene, for example, and is preferably a low-density material such as LDPE and LLDPE.

The vinyl bag having cleanliness as described above is produced by washing with an acid aqueous solution (all three kinds of acids including nitric acid, hydrofluoric acid, and hydrochloric acid are preferably used), rinsing, and subsequently drying naturally in a clean room. Even in cases where other plastic materials are used instead of a resin material, a glove is produced instead of a bag, and other shapes are chosen instead of a bag-like shape, cleanliness as described above is still achieved by washing in the same manner as above.

Table 1 shows the summarized results of investigating the degree of influence of a concentration level of the surface contamination of jigs (A to G) made of a resin material used in each step on a concentration of the surface contamination of polycrystalline silicon that comes into contact with those jigs.

TABLE 1

| | Resin | Washing | Resin material: surface concentration (pptw) | | | | | | Polycrystalline silicon: surface concentration (pptw) | | | | | |
|---|---|---|---|---|---|---|---|---|---|---|---|---|---|---|
| | | | P | As | B | Al | Σ6 | Σ10 | P | As | B | Al | Σ6 | Σ10 |
| A | LDPE | Unwashed | 7598 | 2 | 31 | 3451 | 8459 | 12451 | 52 | <1 | 3 | 19 | 978 | 1008 |
| | | Washed | 35 | 1 | 7 | 4 | 75 | 65 | 2 | <1 | <2 | <1 | 34 | 21 |
| B | PVDF | Unwashed | 1263 | 2 | 20 | 2487 | 2487 | 1298 | 14 | <1 | 3 | 17 | 845 | 612 |
| | | Washed | 46 | 2 | 11 | 7 | 54 | 65 | 2 | <1 | <2 | <1 | 12 | 29 |
| C | LDPE | Unwashed | 9871 | 2 | 78 | 6542 | 9987 | 11985 | 68 | <1 | 9 | 35 | 1241 | 912 |
| | | Washed | 31 | <1 | 14 | 4 | 32 | 49 | 2 | <1 | <2 | 3 | 29 | 36 |
| D | PVDF | Unwashed | 1987 | 2 | 40 | 3987 | 4521 | 1249 | 19 | <1 | 3 | 25 | 912 | 896 |
| | | Washed | 24 | 2 | 7 | 8 | 14 | 54 | 2 | <1 | <2 | <1 | 24 | 21 |
| E | PVDF | Unwashed | 2541 | 2 | 37 | 3541 | 8547 | 12412 | 29 | <1 | 5 | 39 | 1145 | 1089 |
| | | Washed | 17 | 2 | 15 | 6 | 65 | 98 | 2 | <1 | <2 | <1 | 59 | 65 |
| F | LLDPE | Unwashed | 459 | <1 | 28 | 150 | 1201 | 942 | 12 | <1 | 4 | 15 | 210 | 230 |
| | | Washed | 49 | <1 | 18 | 2 | 70 | 84 | 2 | <1 | <2 | <1 | 35 | 30 |
| G | LLDPE | Unwashed | 398 | <1 | 32 | 165 | 1105 | 879 | 9 | <1 | 4 | 17 | 248 | 212 |
| | | Washed | 47 | <1 | 19 | 2 | 54 | 88 | 3 | <1 | <2 | <1 | 21 | 19 |

The jigs A to G represent a vinyl glove (A) used when taking out the polycrystalline silicon rod from a reactor, a resin plate (B) used for crushing the polycrystalline silicon rod, a vinyl glove (C) used when handling the polycrystalline silicon mass produced by crushing, a resin member (D) constituting a washing tank, a plumbing, and a pump component used for acid-washing the polycrystalline silicon mass, a resin member (E) constituting a washing tank used when rinsing the acid-washed polycrystalline silicon mass, a vinyl glove (F) used when handling the rinsed polycrystalline silicon mass, and a vinyl bag (G) for packing the polycrystalline silicon mass, respectively.

In the column of Resin, LDPE is low density polyethylene, LLDPE is linear low density polyethylene, and PVDF is polyvinylidene fluoride. A washed resin and an unwashed resin are separately made to go through the production process, and a comparison is made between a degree of contamination of a resin surface and that of a polycrystalline silicon surface.

Each resin was washed with an acid aqueous solution (all three kinds of acids, nitric acid, hydrofluoric acid, and hydrochloric acid, were used), and rinsed, and then naturally dried in a clean room.

Σ6 in Table 1 means a total concentration of 6 elements of iron (Fe), chromium (Cr), nickel (Ni), copper (Cu), sodium (Na), and zinc (Zn). Σ10 means a total concentration of 10 elements of lithium (Li), potassium (K), calcium (Ca), titanium (Ti), manganese (Mn), cobalt (Co), molybdenum (Mo), tin (Sn), tungsten (W), and lead (Pb).

According to the result shown in Table 1, about 1/10 of the surface impurity concentration of the resin material is roughly equivalent to the surface impurity concentration of polycrystalline silicon that is brought into contact with the resin material. That is, to keep the surface of polycrystalline silicon clean, it is necessary to keep the impurity concentration of the contacting surface of the resin material low. When a total concentration of 6 elements of iron (Fe), chromium (Cr), nickel (Ni), copper (Cu), sodium (Na), and zinc (Zn) is 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) is 100 pptw or less, it can be said that cleanliness of the polycrystalline silicon surface is generally kept at a good level.

Impurity analysis was performed on the polycrystalline silicon surface by the following method. First, 150 g of a sample was placed in a clean PTFE Teflon® beaker, and a surface of the sample was heated and extracted for 10 minutes using 200 ml of an extraction liquid. The extraction liquid was a mixture of hydrofluoric acid, hydrogen peroxide, and water. The concentrations of hydrofluoric acid and hydrogen peroxide were 25 wt % and 0.35 wt %, respectively.

A 1.0 ml aliquot of the extraction liquid was precisely taken out from the obtained extraction liquid and placed in a clean PTFE Teflon® evaporating dish, which was heated and evaporated to make it dissolved in 1.0 ml of a 1 wt %-nitric acid aqueous solution. A resultant liquid was then quantitatively analyzed for dopant elements and metallic elements by the ICP-MS/MS or ICP-MS.

EXAMPLES

Example 1

In a process for producing a polycrystalline silicon mass, which is a raw material for producing CZ-single crystalline silicon, from a grown polycrystalline silicon rod, the following cases were compared with one another. Regarding the impurity concentration in a bulk of CZ-single crystalline silicon to be finally produced, a comparison was made between a case where the polycrystalline silicon mass produced consistently using an unwashed resin material was used as a raw material and a case where the polycrystalline silicon mass produced consistently using a washed resin material was used as a raw material. Results are shown in Table 2.

TABLE 2

| Washing | Polycrystalline silicon mass: surface concentration (pptw) | | | | | | CZ-single crystalline silicon: bulk concentration (pptw) | | | | | |
|---|---|---|---|---|---|---|---|---|---|---|---|---|
| | P | As | B | Al | Σ5 | Σ10 | P | As | B | Al | Σ6 | Σ10 |
| Unwashed | 48 | <1 | 3 | 35 | 389 | 451 | 4 | <1 | 3 | 3 | 9 | 4 |
| Washed | 2 | <1 | <2 | <1 | 32 | 21 | 1 | <1 | 1 | <1 | 2 | 1 |

According to the surface impurity concentration of the washed resin material as described above, a total concentration of 6 elements of iron (Fe), chromium (Cr), nickel (Ni), copper (Cu), sodium (Na), and zinc (Zn) was 80 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) was 100 pptw or less. The surface impurity concentration of the polycrystalline silicon mass as well as the bulk impurity concentration of CZ-single crystalline silicon showed a higher level of cleanliness as compared to those in the case where the unwashed resin material was used.

Example 2

In a process for producing a FZ-single crystalline silicon rod using a polycrystalline silicon rod obtained from a grown polycrystalline silicon rod, the following cases were compared with one another. Regarding the impurity concentration in a bulk of FZ-single crystalline silicon to be finally produced, a comparison was made between a case where the polycrystalline silicon rod produced consistently using an unwashed resin material was used as a raw material and a case where the polycrystalline silicon rod produced consistently using a washed resin material was used as a raw material. Results are shown in Table 3.

TABLE 3

| Washing | Polycrystalline silicon rod: surface concentration (pptw) | | | | | | FZ-single crystalline silicon: bulk concentration (pptw) | | | | | |
|---|---|---|---|---|---|---|---|---|---|---|---|---|
| | P | As | B | Al | Σ6 | Σ10 | P | As | B | Al | Σ6 | Σ10 |
| Unwashed | 32 | <1 | 3 | 42 | 421 | 542 | 3 | <1 | 3 | 3 | 4 | 2 |
| Washed | 2 | <1 | <2 | <1 | 29 | 31 | 1 | <1 | 1 | <1 | 2 | 1 |

According to the surface impurity concentration of the washed resin material described above, the total concentration of 6 elements of iron (Fe), chromium (Cr), nickel (Ni), copper (Cu), sodium (Na), and zinc (Zn) was 80 pptw or less, and the total concentration of 10 elements of lithium (Li), potassium (K), calcium (Ca), titanium (Ti), manganese (Mn), cobalt (Co), molybdenum (Mo), tin (Sn), tungsten (W), and lead (Pb) was 100 pptw or less. The surface impurity concentration of the polycrystalline silicon rod as well as the bulk impurity concentration of FZ-single crystalline silicon showed a higher level of cleanliness as compared to those in the case where the unwashed resin material was used.

INDUSTRIAL APPLICABILITY

According to the present invention, a resin material which is suitable for keeping a surface of polycrystalline silicon clean and also does not lead to an increase in production cost of polycrystalline silicon, and a vinyl bag made of such a resin material are provided.

The invention claimed is:
1. A method for handling a polycrystalline silicon rod, comprising handling the polycrystalline silicon rod that has been synthesized by Siemens method, while keeping the polycrystalline silicon rod in a vinyl bag,
   wherein the vinyl bag is composed of a vinyl material,
   wherein inner surface impurities of the vinyl material are controlled so that after contact with the vinyl material, surface impurities of the polycrystalline silicon rod have a phosphorus (P) concentration of 3 pptw or less, an arsenic (As) concentration of 1 pptw or less, a boron (B) concentration of 2 pptw or less, an aluminum (Al) concentration of 3 pptw or less, a total concentration of 6 elements of iron (Fe), chromium (Cr), nickel (Ni), copper (Cu), sodium (Na), and zinc (Zn) of 59 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 65 pptw or less, and
   wherein the surface impurities of the polycrystalline silicon rod are measured by contacting a surface of a 150 g sample of the polycrystalline silicon rod with 200 ml of an extraction liquid composed of 25 wt% hydrofluoric acid, 0.35 wt% hydrogen peroxide, and water, performing extraction for 10 minutes, and performing a quantitative analysis of the extraction liquid by ICP-mass spectrometry.

2. The method according to claim 1, further comprising:
   selecting the vinyl bag; and
   packing the polycrystalline silicon rod in the vinyl bag.

3. The method according to claim 1, wherein the vinyl material comprises at least one of low-density polyethylene, linear low-density polyethylene, and polyvinylidene fluoride.

4. A method for selecting a vinyl bag for packing a polycrystalline silicon rod that has been synthesized by Siemens method,
   wherein the vinyl bag is composed of a vinyl material,
   wherein inner surface impurities of the vinyl material are controlled so that after contact with the vinyl material, surface impurities of the polycrystalline silicon rod have a phosphorus (P) concentration of 3 pptw or less, an arsenic (As) concentration of 1 pptw or less, a boron (B) concentration of 2 pptw or less, an aluminum (Al) concentration of 3 pptw or less, a total concentration of 6 elements of iron (Fe), chromium (Cr), nickel (Ni), copper (Cu), sodium (Na), and zinc (Zn) of 59 pptw or less, and a total concentration of 10 elements of lithium (Li), potassium (K), calcium (Ca), titanium (Ti), manganese (Mn), cobalt (Co), molybdenum (Mo), tin (Sn), tungsten (W), and lead (Pb) of 65 pptw or less, and
   wherein the surface impurities of the polycrystalline silicon rod are measured by contacting a surface of a 150 g sample of the polycrystalline silicon rod with 200 ml of an extraction liquid composed of 25 wt% hydrofluoric acid, 0.35 wt% hydrogen peroxide, and water, performing extraction for 10 minutes, and performing a quantitative analysis of the extraction liquid by ICP-mass spectrometry.

* * * * *